(12) United States Patent
Lee et al.

(10) Patent No.: US 8,513,641 B2
(45) Date of Patent: Aug. 20, 2013

(54) CORE-SHELL NANOWIRE COMPRISING SILICON RICH OXIDE CORE AND SILICA SHELL

(75) Inventors: Eun Kyung Lee, Suwon-si (KR); Byoung Lyong Choi, Seoul (KR); Gyeong Su Park, Suwon-si (KR); Jai Yong Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 12/350,709

(22) Filed: Jan. 8, 2009

(65) Prior Publication Data

US 2010/0065809 A1  Mar. 18, 2010

(30) Foreign Application Priority Data

Aug. 5, 2008  (KR) .................. 10-2008-0076325

(51) Int. Cl.
 *H01L 29/06* (2006.01)
(52) U.S. Cl.
 USPC ............. 257/9; 257/2; 257/14; 257/E21.168; 438/478; 438/706; 438/361; 438/367
(58) Field of Classification Search
 USPC .......... 257/9, 24, E29.07, 2, 14, 79, E29.168; 438/660, 478, 706, 361, 367; 977/742, 762, 977/843, 784, 891
 See application file for complete search history.

(56) References Cited

U.S. PATENT DOCUMENTS

2008/0230763 A1* 9/2008 Zaidi et al. .................. 257/9
2009/0127540 A1* 5/2009 Taylor ............................ 257/14

FOREIGN PATENT DOCUMENTS

| JP | 2002-154819 | 5/2002 |
| JP | 2007-055840 | 3/2007 |
| JP | 2007-319988 | 12/2007 |
| KR | 10-2006-0094862 | 8/2006 |
| KR | 10-2006-0098959 | 9/2006 |
| KR | 10-2007-0048943 | 5/2007 |

OTHER PUBLICATIONS

Lin et al. "Anomalous Absorption of Silicon Nano-crystals in Silicon-rich SiO1.25 matrix precipitated by Laser Annealing" Opt.l Soc. Amer. (2006).*
Zhenrui Yu et al., Study of the conduction properties of silicon-rich oxide under illumination, Thin Solid Films 473 (2005), pp. 145-150.
Zhihong Liu et al., Magnesium catalyzed growth of SiO2 hierarchical nanostructures by a thermal evaporation process, IOP Publishing Ltd., (online at stacks.iop.org/Nano/19/165601), Mar. 20, 2008, pp. 1-4.
Florian M. Kolb et al., Periodic chains of gold nanoparticles and the role of oxygen during the growth of silicon nanowires, Applied Physics Letters 89, 173111, Oct. 24, 2006.

* cited by examiner

*Primary Examiner* — Evan Pert
*Assistant Examiner* — Mark A Laurenzi
(74) *Attorney, Agent, or Firm* — Cantor Colburn LLP

(57) ABSTRACT

Disclosed herein is a nanowire including silicon rich oxide and a method for producing the same. The nanowire exhibits excellent electrically conducting properties and optical characteristics, and therefore is effectively used in a variety of applications including, for example, solar cells, sensors, photodetectors, light emitting diodes, laser diodes, EL devices, PL devices, CL devices, FETs, CTFs, surface plasmon waveguides, MOS capacitors and the like.

7 Claims, 7 Drawing Sheets

CORE-SHELL NANOWIRE COMPRISING SILICON RICH OXIDE CORE AND SILICA SHELL

CROSS-REFERENCE TO RELATED APPLICATION

This application claims priority to Korean Patent Application No. 10-2008-0076325, filed on Aug. 5, 2008, and all the benefits accruing therefrom under 35 U.S.C. §119, the contents of which in its entirety are herein incorporated by reference.

BACKGROUND

1. Field

This disclosure relates to a nanowire comprising a silicon rich oxide and a method for producing the same. More particularly, disclosed herein is a nanowire with excellent conductive properties and optical characteristics. The nanowire comprises a silicon rich oxide. Disclosed herein too is a method for easily producing the nanowire.

2. Description of the Related Art

A nanowire is a material having a linear shape. In general, nanowires have a diameter that is on the order of nanometers, a length of several hundred nanometers, micrometers or millimeters and different physical properties depending on the diameter and/or the length thereof. Nanowires having diameters that are in the nanometer range display quantum-limited electrical and/or optical characteristics. These characteristics are distinguishable from those of the same material in its bulk form. As a result, nanowires have received considerable attention as an advanced technology material that can be used for a variety of applications in electronic devices and as optical elements. Silicon nanowires that are capable of being employed in current silicon semiconductor technology have recently been drawing increased interest and attention as an alternative approach to overcome restrictions in technological equipment designs at length scales of several tens of nanometers.

Accordingly, it is desirable to have a novel nanowire with improved electrical and/or optical characteristics, in addition to having a simple method for mass-production of the nanowire.

SUMMARY

Disclosed herein are embodiments relating to a nanowire having excellent electrical conducting properties and optical characteristics the nanowire comprising a silicon rich oxide.

Disclosed herein too are embodiments that provide a method for easily forming the nanowire having different structures depending on the location of a substrate.

Disclosed herein too are embodiments that provide for an electronic device that comprises the nanowire; the nanowire being manufactured by the disclosed method; the nanowire displaying excellent photosensitivity and electrical conductivity.

According to another embodiment of the disclosure, there is provided a method for production of the nanowire which comprises a silicon rich oxide; the method comprising coating a silicon substrate with a metallic catalyst preparing a chamber; introducing a gas into the chamber; and heating the chamber, such that a nanowire source diffuses or vaporizes from the silicon substrate to form the nanowire.

According to a further embodiment of the disclosure, there is provided an electronic device that comprises the nanowire, which comprises the silicon rich oxide formed as described above; the electronic device being a solar cell, a sensor, a photodetector, a light emitting diode, a laser diode, an electroluminescent ("EL") device, a photoluminescent ("PL") device, a cathodoluminescence ("CL") device, a field effect transistor ("FET"), a charge trap flash ("CTF"), a surface plasmon waveguide, a metal oxide semiconductor ("MOS") capacitor, and the like.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION

Figure 1:
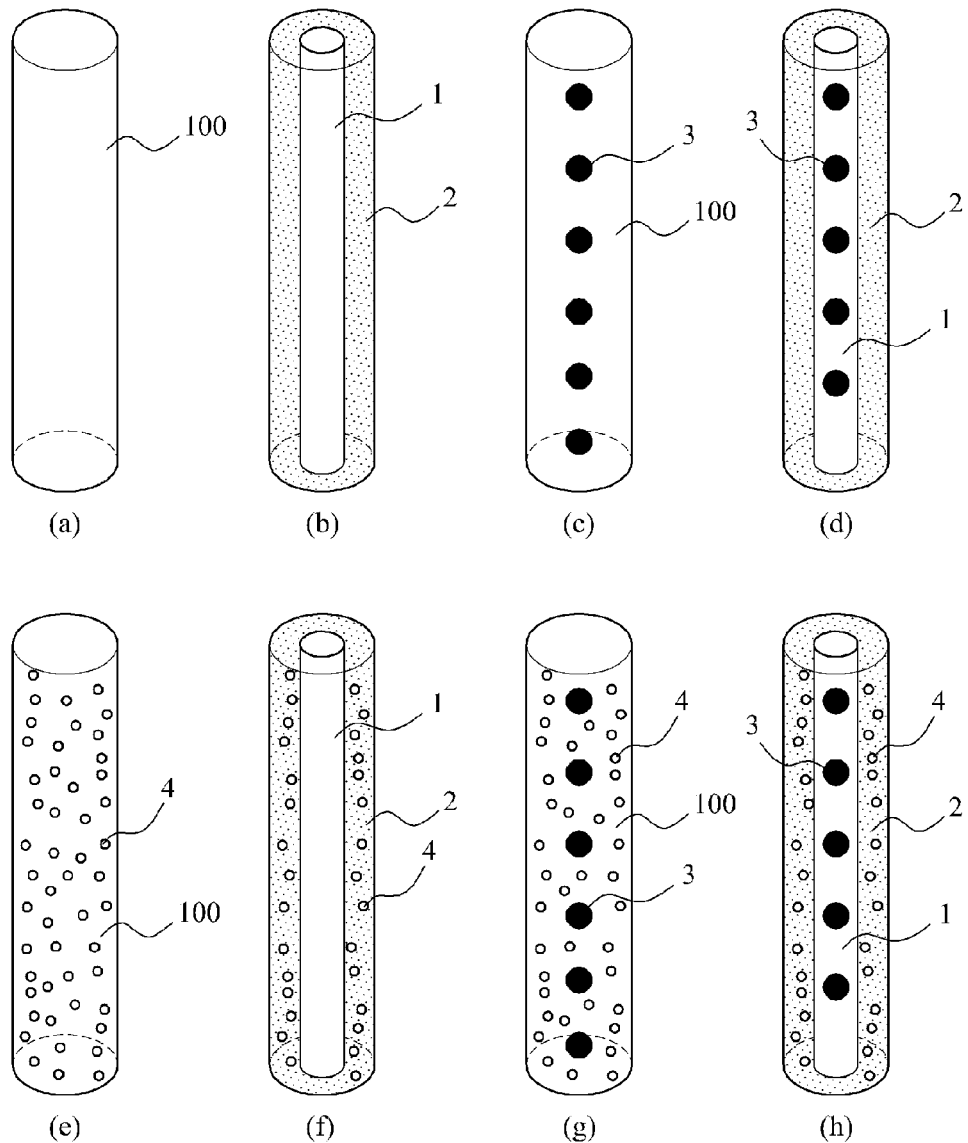
FIGS. 1A to 1H are schematic perspective views illustrating exemplary embodiments of nanowires.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

As disclosed above, a nanowire according to the embodiments of the disclosure having superior electrically conducting properties and optical characteristics is effectively employed in a variety of applications such as a solar cell, a sensor, a photodetector, a light emitting diode, a laser diode, an EL device, a PL device, a CL device, an FET, a CTF, a surface plasmon waveguide, a MOS capacitor, and the like.

Exemplary embodiments of the disclosure will now be described in greater detail with reference to the accompanying drawings.

According to one exemplary embodiment, the nanowire comprises a silicon rich oxide. The silicon rich oxide exists in a form of $SiO_x$ ($0<x<2$) and comprises an excess of silicon. When the nanowire comprises the silicon rich oxide having a high silicon content, the nanowire may exhibit better electrically conducting properties and optical characteristics than other comparative bulk silica nanowires, thereby overcoming technical limitations that limit the use of silica or silicon nanowires in various commercial applications.

FIGS. 1(a) to 1(h) are exemplary schematic perspective views illustrating nanowires according to exemplary embodiments of this disclosure. Referring to FIG. 1A, the nanowire 100 according to one exemplary embodiment is of a linear shape and comprises only the silicon rich oxide. Referring to FIG. 1B, the nanowire according to another exemplary embodiment includes a core part 1 and a shell part 2, in which the core part 1 comprises a crystalline or an amorphous silicon rich oxide while the shell part 2 includes silica. In this case, the silica contained in the shell part 2 may be generated by the oxidation of silicon with oxygen in air during the formation of the nanowire.

As illustrated in FIG. 1C, the nanowire according to another exemplary embodiment may have a structure wherein metal nanodots 3 are aligned in a certain direction within the nanowire 100, which comprises the silicon rich oxide. In one embodiment, the nanodots 3 are aligned in a direction that is parallel to the length of the nanowire. The nanodots are generally aligned along a longitudinal axis of the nanowire.

As illustrated in FIG. 1D, the nanowire according to another exemplary embodiment comprises a core part 1 and a shell part 2, in which the core part 1 includes metal nanodots 3 aligned in a certain direction. The nanowire comprising a nanodot array arranged at a center of the nanowire in a certain direction may be favorably used in the fabrication of electronic devices and/or optical devices. In this regard, the core part 1 of the nanowire functions by being in operative and physical communication with the metal nanodots.

The metal nanodots 3 may comprise metals capable of being used as a catalyst for growing the nanowire. In one embodiment, the metal used as a catalyst is at least one selected from the group consisting of gold (Au), nickel (Ni), iron (Fe), silver (Ag), aluminum (Al), palladium (Pd), and the like, and mixtures thereof.

Herein, the metal nanodots aligned in a certain direction in the nanowire may have a diameter equal to or smaller than that of the nanowire without any particular limitation. The metal nanodots may be aligned at a desired interval of about 10 nanometers ("nm") to about 1 micrometer ("μm").

According to another exemplary embodiment of the disclosure, a nanowire may comprise silicon dots 4 in the nanowire 100, which comprises the silicon rich oxide as illustrated in FIG. 1E.

Also, as illustrated in FIG. 1F, the nanowire according to another exemplary embodiment may comprise a core part 2 and a shell part 2, in which the shell part 2 may include silicon dots 4 distributed therein.

As illustrated in FIG. 1G, the nanowire 100, which comprises the silicon rich oxide according to another exemplary embodiment may include metal nanodots 3 aligned in a certain direction in the nanowire 100 and may also include silicon dots 4 in the nanowire 100.

As illustrated in FIG. 1H, the nanowire 100 according to another exemplary embodiment may comprise a core part 1 and a shell part 2, in which the core part 1 has a metal nanodot array while the shell part 2 comprises silicon dots 4 distributed therein.

Such silicon dots 4 may serve to improve optical characteristics compared with other comparative commercially available existing bulk silicon, thus being effectively used in light emitting devices, light receiving devices, and/or memory devices. For example, heating a nanowire that includes the silicon rich oxide to a high temperature of at least 1000° C. and/or laser irradiating the same may allow excess silicon to form a silicon nucleus and generate silicon quantum dots that have an average particle size of several nanometers. As for the nanowires illustrated in FIGS. 1F and 1H, silicon dots 4 are generated in the shell part 2 because of excess silicon contained in the silicon rich oxide in the core part 1. Such silicon dots may exhibit optical characteristics, which are not generally obtainable from conventional bulk silicon, thus emitting and/or absorbing light in the visible spectrum.

Other exemplary embodiments are directed to a method for production of a nanowire with a structure described above, including silicon rich oxide.

According to one exemplary embodiment of the disclosure, a method for production of a nanowire comprises coating a silicon substrate with a metallic catalyst. A lid is then disposed at a location that is opposed to the exposed surface of the metallic catalyst. The combination of the lid with the silicon substrate (coated with the metallic layer) is called a chamber. Following the formation of the chamber, a gas is introduced into the chamber. The introduction of the gas into the chamber can be conducted in a furnace. The chamber is then subjected to heating in the furnace. The gases present in the furnace promote the diffusion or vaporization of a nanowire source through the substrate and facilitate the production of the nanowires.

During the production of the nanowires, a susceptor may be placed beneath the silicon substrate. In other words, the susceptor may be disposed on a surface of the silicon substrate that is opposed to the surface of the substrate that is in contact with the metallic catalyst.

A nanowire growing process can be exemplified by a vapor-liquid-solid ("VLS") process or a solid-liquid-solid ("SLS") process, or a combination thereof.

More particularly, the VLS process comprises coating a silicon substrate with a metallic catalyst such as Au, Co, Ni, and the like, placing the coated substrate in a high temperature furnace, and introducing an external silicon source (e.g., silane ("$SiH_4$")) in the form of a gaseous phase into the furnace chamber so that vapor phase silicon based ingredients are condensed and formed into crystals on a surface of the catalyst (in a molten state), which in turn, are grown into a silicon nanowire.

On the other hand, the SLS process is characterized in that silicon diffuses from the solid substrate (i.e., the silicon substrate coated with the metallic catalyst), is condensed and formed into crystals on a surface of the catalyst in a molten state, which in turn, are grown into a silicon nanowire, without the addition of alternative vapor phase silicon.

The exemplary embodiments disclosed above substantially adapt the SLS process and/or the VLS process to form the nanowire, each operation of which will be more clearly understood from the following description.

(a) Coating of Silicon Substrate with Metallic Catalyst

Figure 2A:
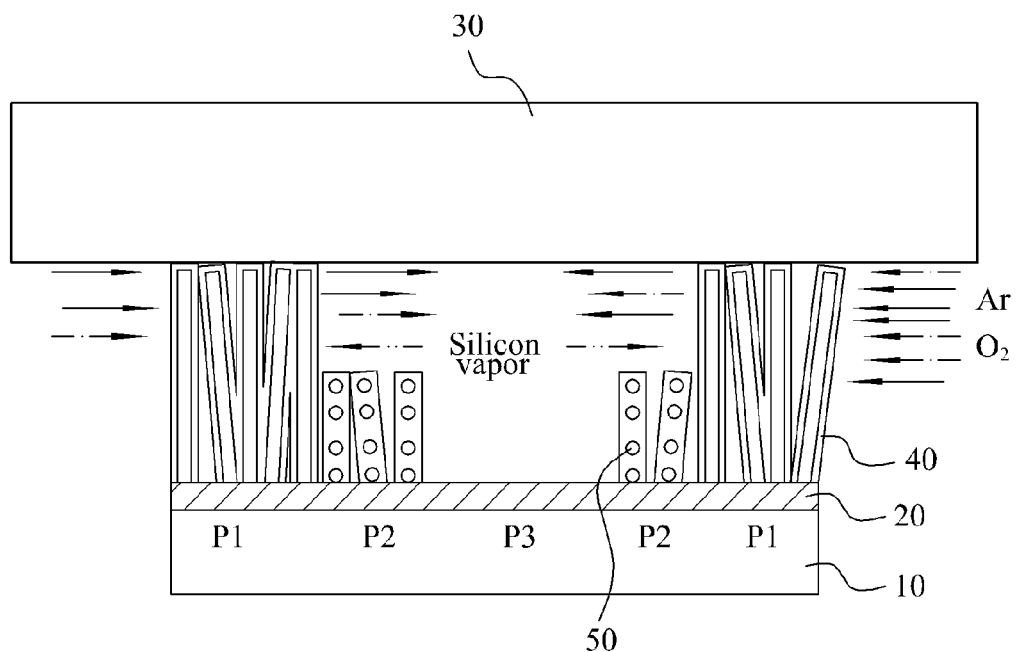
FIGS. 2A and 2B are schematic cross-sectional views illustrating an exemplary embodiment of an apparatus for producing a nanowire.

With reference to the FIG. 2A, a process for producing a nanowire according to one exemplary embodiment of the disclosure includes applying a metallic catalyst, for example, a layer of Au catalyst to a silicon substrate 10 to form a coating layer 20. In order to remove foreign materials or impurities, the substrate 10 may be washed prior to the deposition of the metal catalyst according to any conventional method.

The silicon substrate 10 may include general substrates so long as they serve as a wire source for growing the nanowire. More particularly, the substrate may comprise a silicon substrate. In one embodiment, a glass or plastic substrate coated with silicon may be used instead of the silicon substrate.

The metallic catalyst applied to the silicon substrate may include general metallic catalysts so long as they can grow a wire. In one embodiment, the metallic catalysts are transition metals. The catalyst may comprise Au, Ni, Fe, Ag, Al, Pd and mixtures thereof but is not particularly limited thereto.

The metallic catalyst used herein may be applied to the substrate so as to form a coating layer 20 in the form of nanoparticles or in the form of a thin film. Such a coating layer may have a thickness of not more than about 50 nm.

Any method of coating the substrate with a metallic catalyst may be used unless it is contrary to purposes of the disclosure. This may include processes such as, for example, chemical vapor deposition ("CVD"), sputtering, e-beam evaporation, vacuum vapor deposition, spin coating, dipping, and the like. In an exemplary embodiment, spin coating or dipping may be conducted for purposes of coating the substrate with any commonly known catalyst.

A nanowire according to another exemplary embodiment has different diameters based on diameter of the metallic catalyst. Accordingly, regulating the diameter of the metallic catalyst controls the diameter of the nanowire.

(b) Preparation of Chamber

Following this, a chamber is prepared. The chamber may include a common chamber having a size sufficient to grow the nanowire. The silicon substrate is placed in the chamber. Then, introducing a gas such as Ar as well as oxygen to the chamber facilitates the growing of the nanowire. A detailed description will be given for the growth of the nanowire in the following section (c) below.

Referring to FIG. 2A, the chamber is prepared by disposing a lid 30 on the silicon substrate 10 coated with the metallic catalyst as described in the above operation (a). The lid is disposed at a location that is opposed to the exposed surface of the metal catalyst. A gap of about 10 to about 100 μm exists between the lid 30 and the substrate 10, although embodiments of the disclosure are not particularly limited thereto. The lid 30 may be made using refractory materials such as quartz, silicon carbide ("SiC"), and the like, although embodiments of the disclosure are not particularly limited thereto.

Figure 2B:
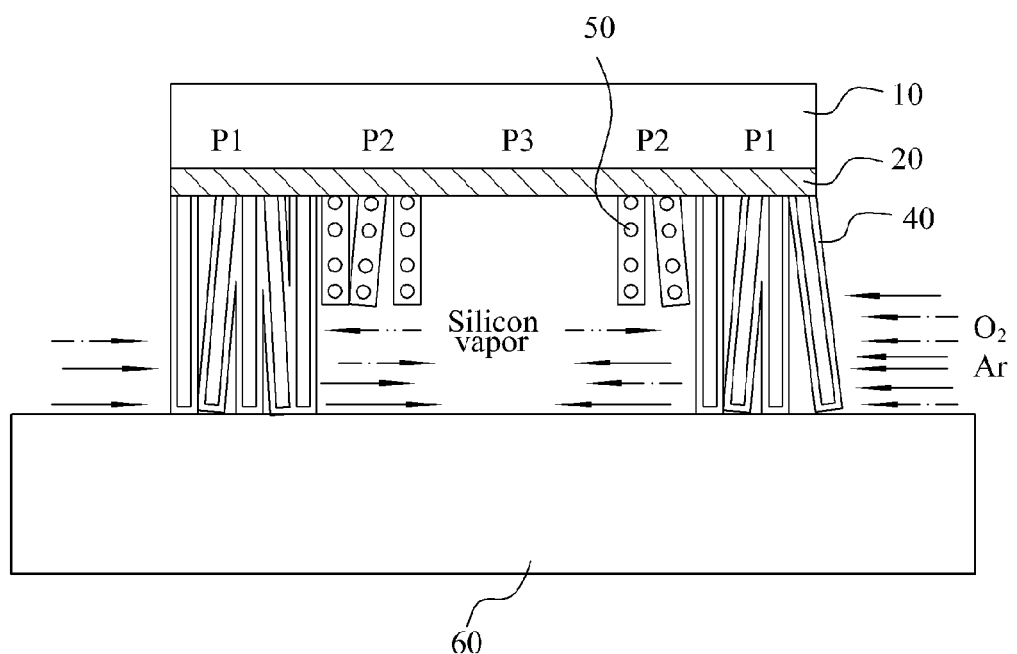

The chamber serves as a reaction furnace for growing nanowires as illustrated in the FIG. 2B. Thus, in one embodiment, the coated silicon substrate 10 obtained from operation (a) is used in conjunction with the susceptor 60 to form the chamber. As noted above, the coated silicon substrate 10 and the susceptor 60 may have a gap of about 10 nm to about 100 μm between them thereby forming the chamber.

(c) Formation of the nanowire using a nanowire source that diffuses or vaporizes from silicon substrate during heating According to the embodiments of the disclosure, a nanowire is formed using a nanowire source that diffuses or vaporizes from the substrate without addition of an alternative nanowire source in a vapor phase.

When the nanowire is formed in the chamber, oxygen may be introduced in a desired amount together with at least one gas selected from argon (Ar), nitrogen ("N$_2$"), helium (He), hydrogen ("H$_2$") and any mixtures thereof such that the chamber is subjected to an internal oxygen partial pressure of about $2\times10^{-1}$ torr to about $2\times10^{-6}$ torr, or about $2\times10^{-2}$ torr to about $2\times10^{-6}$ torr. In this case, the small amount of oxygen plays a role in the growth of the nanowire in the chamber. As noted above, the nanowire comprises the silicon rich oxide. In other words, introducing a desirable amount of oxygen into the chamber sufficient to reach the internal oxygen partial pressure of about $2\times10^{-1}$ torr to about $2\times10^{-6}$ torr results in growth of the nanowire having the composition SiO$_x$ (where $0<x<2$), thus producing the nanowire, which comprises the silicon rich oxide. If the amount of oxygen to be introduced exceeds a desired level, thus increasing the internal oxygen partial pressure to more than about $2\times10^{-1}$ torr, a silica ("SiO$_2$") nanowire may be obtained. On the other hand, when the amount of oxygen to be introduced is less than the desired level, thus decreasing the internal oxygen partial pressure below about $2\times10^{-6}$ torr, a silicon (Si) nanowire may be formed.

As to formation of a nanowire in a chamber as illustrated in FIGS. 2A and 2B, a metallic catalyst coating layer 20 is formed on a silicon substrate 10, followed by covering the coated substrate with a lid 30 (FIG. 2A), or otherwise, opposedly disposing the substrate having the coating layer toward a susceptor 60 (FIG. 2B) so as to form a chamber. Introducing a gas into the chamber while heating the chamber may promote the diffusion or vaporization of a nanowire source from the substrate, resulting in formation of the nanowire as the end product.

The gas used in producing the nanowire in the chamber is not particularly limited but may include Ar, N$_2$, He, H$_2$ and any mixtures thereof. In addition, the flow rate of the gas to be introduced may be about 0.001 to about 10 standard liters per minute ("slm"), although these values may change when using different processes.

Heating the chamber while introducing the gas into the chamber may be conducted at a pressure of about 10 to about 760 torr and a temperature of about 400 to about 1,300° C., or about 800 to about 1,200° C. over several minutes to several hours. However, conditions such as processing pressure, heating temperature and/or heating time may be dependent on different processes employed for the growth of the nanowires and hence may vary from those prescribed.

Moreover, heating the chamber while introducing the gas into the chamber may cause metal components of the catalyst coating layer on the silicon substrate to be incorporated into the nanowire during the growth of the nanowire.

Without being limited by theory, the growth of the nanowire may be based on the concept that silicon initially co-existing with the metallic catalyst in a liquid phase is precipitated together with metal components contained in the catalyst. For instance, applying an electric field and/or mechanical force may adjust the gap between metal nanodots and/or regulate the content of the silicon rich oxide in the nanowire, thus producing a nanowire having different physical (or mechanical) properties.

As described above, metal nanodots contained in the nanowire are generated during the growth of the nanowire. Therefore, the number of nanodots depends on an amount of a metallic catalyst applied to the original silicon substrate.

As for the nanowires formed in the chamber, different kinds of nanowires (having different physical properties) are formed at the periphery of the silicon substrate from those formed at the center portion of a silicon substrate. More particularly, a first type of nanowire is formed around the periphery of the silicon substrate, while a second type of nanowire is formed inside of the substrate. As can be seen in the FIGS. 2A and 2B, the second type of nanowire is encompassed by the first type of nanowire.

A process for producing the nanowires will now be described in greater detail. Referring to FIGS. 2A and 2B, the first type of nanowires 40 are formed around the periphery (position P1) of the silicon substrate through an SLS process using silicon atoms diffused from the solid substrate as a nanowire source. Each of the formed nanowires 40 consists of a core part and a shell part, in which the core part may comprise a crystalline or an amorphous silicon rich oxide while the shell part may comprise silica.

Instead of directly introducing an external nanowire source, such as vapor phase silicon vaporized from the silicon substrate as the nanowire source, the second type of nanowires may be formed through a VLS-like process inside the substrate, especially, at the inner areas of the substrate (position P2) encompassed by the first type of nanowires 40. In other words, although the VLS process requires introduction of an external vapor phase nanowire source, a process that is characterized by: firstly forming an area surrounded with the first type of nanowires in a silicon substrate; generating a silicon vapor from the substrate while heating the substrate to increase an internal temperature of the substrate; filling an inner space of the substrate with the silicon vapor; and using vapor phase silicon vaporized from the treated substrate as a nanowire source, thus resulting in growth of the second type of nanowires. The above disclosed process may be defined herein as "a vapor-liquid-solid ("VLS")-like process."

The second type of nanowires described above may include metal nanodots aligned in a certain direction therein.

The nanowire source, which vaporizes from the substrate depends on a surface area of the substrate. That is, as the surface area is increased, the amount of the nanowire source that vaporizes increases while accelerating formation of the nanowire.

Varying the heating temperature and/or the heating time may control the length of the nanowire to be grown. Also, natural cooling or cooling under a gas flow such as nitrogen at a flow rate of several standard cubic centimeters ("sccm") to several liters to decrease the temperature of the substrate to about 700° C., may terminate nanowire growth.

Furthermore, an additional oxidation process may be performed to control the width of the nanowire. More particularly, an oxidation process may be conducted after forming the nanowire, so as to accelerate formation of a silicon oxide layer at the external surfaces of the nanowire, thereby controlling a thickness of the nanowire.

(d) Generation of Silicon Dots on the Formed Nanowire

According to other embodiments of the disclosure, heating the formed nanowire or laser irradiating the same after operation (c) may form silicon dots. The heating process may be performed at about 800 to about 1,300° C. for about 10 to about 1,500 minutes, however, is dependent on different processing conditions.

As disclosed above, heating a nanowire, which comprises the silicon rich oxide at a high temperature and/or laser irradiating the same may form a silicon nucleus resulting from excess silicon, thereby generating silicon dots with a size of several nanometers. Such silicon dots may be distributed throughout the nanowire.

Other exemplary embodiments of the disclosure are directed to an electronic device having the nanowire, which comprises the silicon rich oxide described above. The electronic device exhibits excellent photo-sensitivity and conductive properties, therefore, may be used in a variety of applications including, for example, solar cells, sensors, photodetectors, light emitting diodes, laser diodes, EL devices, PL devices, CL devices, FETs, CTFs, surface plasmon waveguides and/or MOS capacitors.

Hereinafter, the disclosed embodiments will be explained in more detail with reference to the following examples. However, these examples are given for the purpose of illustration and are not intended to limit the disclosure.

EXAMPLES

Preparation Example 1

Formation of Nanowire

FIG. 2A is a schematic cross-sectional view illustrating an apparatus for production of a nanowire according to an exemplary embodiment of the disclosure. With reference to this drawing, a detailed description will be given of a process for producing the nanowire.

A natural oxide film coated on a silicon substrate 10 is removed through organic cleaning and by using fluoric acid, followed by spin coating the treated substrate with gold nanoparticles (manufactured by Nippon Paint Co., Ltd.) to a thickness of 30 nm. Next, the substrate having a coating layer 20 made of a metallic catalyst is placed on a susceptor and the substrate is covered with a lid 30 to form a chamber. The metallic catalyst contained gold nanoparticles. The chamber is maintained under vacuum and then heated to 1,000° C. while introducing Ar gas at 70 sccm to reach a processing pressure of 500 torr, thus forming the first type of nanowires 40 around a peripheral side (P1) of the silicon substrate 10.

After reaching the processing temperature of 1,000° C., this temperature is maintained for 30 minutes. Silicon gas vaporized from the silicon substrate is used as a nanowire source in the silicon substrate 10, that is, at an inner area (P2) of the silicon substrate which is encompassed by the first type of nanowires 40 so as to grow the second type of nanowires 50 having metal dots therein. Then, the nanowires are allowed to slowly cool under ambient conditions to a temperature of about 700° C. to terminate the growth of the nanowires.

Figure 3:
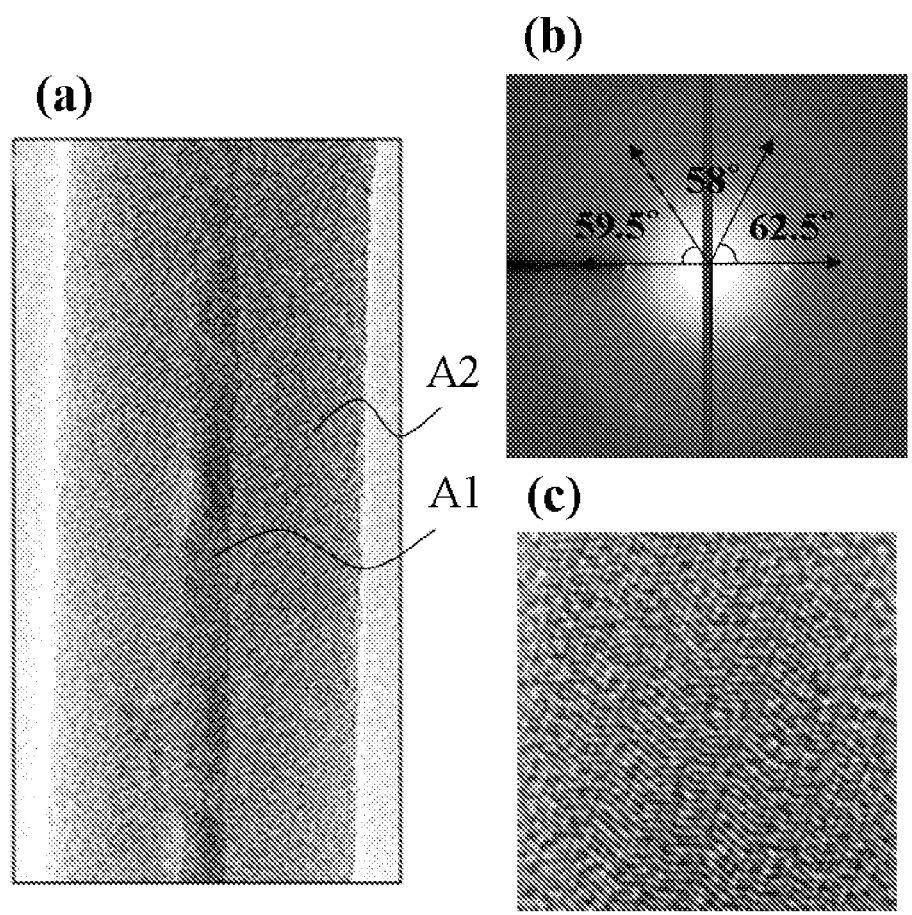
FIGS. 3A to 3C are transmission electron microscopy ("TEM") photographs showing exemplary embodiments of a first type of nanowire formed according to Preparation Example 1.

FIGS. 3A to 3C are TEM photographs showing a first type of nanowire formed according to Preparation Example 1 in the disclosure. More particularly, FIG. 3A is a photograph showing the first type of nanowire grown at P1 indicated in FIG. 2A. It can be observed that the nanowire has a core/shell structure and the formed core part is crystalline while the shell part has an amorphous phase. Referring to FIG. 3B, the core part has a clear crystal lattice. As shown in FIG. 3C, some defects such as twins in crystalline form are observed from an atomic TEM image.

Figure 4A:
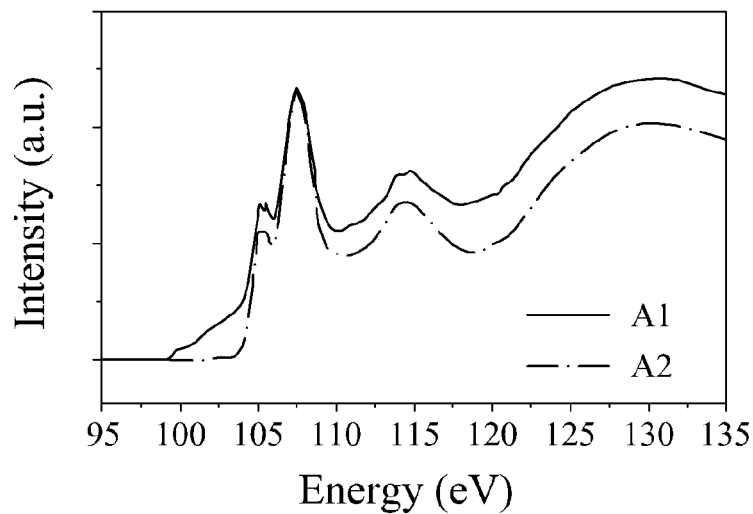
FIG. 4A is a graph illustrating results from an electron energy loss spectroscopy ("EELS") analysis for the first type of nanowire formed according to Preparation Example 1 in the disclosure.
Figure 4B:
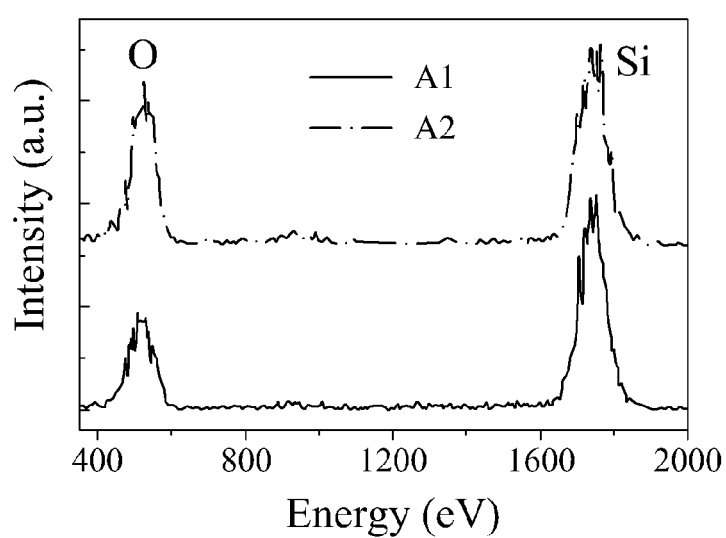
FIG. 4B is a graph illustrating results from an energy dispersive spectroscopy ("EDS") analysis for the first type of nanowire formed according to Preparation Example 1 in the disclosure.

FIGS. 4A and 4B are graphs illustrating results from electron energy loss spectroscopy ("EELS") and energy dispersive spectroscopy ("EDS") analyses for the first type of nanowire formed according to Preparation Example 1 in this disclosure. Referring to FIG. 4A, a difference is observed between graph A1 corresponding to the core part and graph A2 corresponding to the shell part of the first nanowire. Therefore, it is believed that the core part and the shell part have different compositions or phases although both are made of the same ingredients.

Referring to FIG. 4B, graph A1 represented a ratio of Si to oxygen content ("%"), that is, Si:O=47:53, while graph A2 exhibited Si:O=33:67, meaning that both graphs A1 and A2 had a difference in compositions in terms of silicon and oxygen contents. Accordingly, it can be demonstrated that the core part includes silicon rich oxide while the shell part includes silica.

Figure 5:
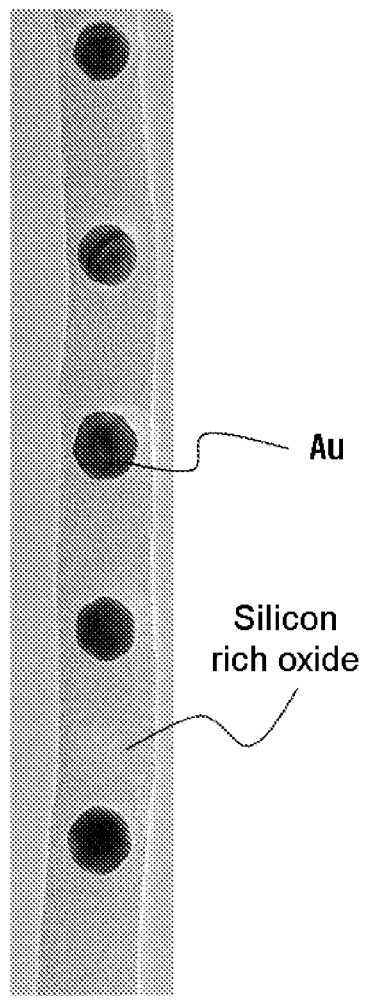
FIG. 5 is a TEM photograph showing a second type of nanowire formed according to Preparation Example 1 in the disclosure.

FIG. 5 is a TEM photograph showing one of second type of nanowires grown at P2 illustrated in FIG. 2A, which includes silicon rich oxide and has a structure of metal (Au) nanodots aligned in a certain direction therein.

Figure 6A:
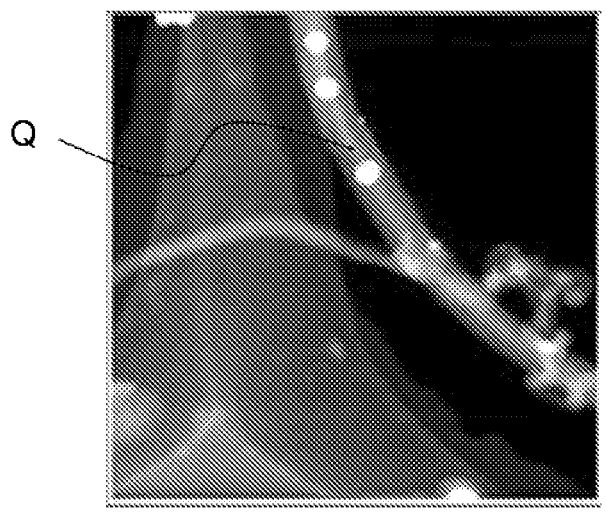
FIGS. 6A and 6B are TEM photographs showing the second type of nanowire formed according to Preparation Example 1 in the disclosure.
Figure 6B:
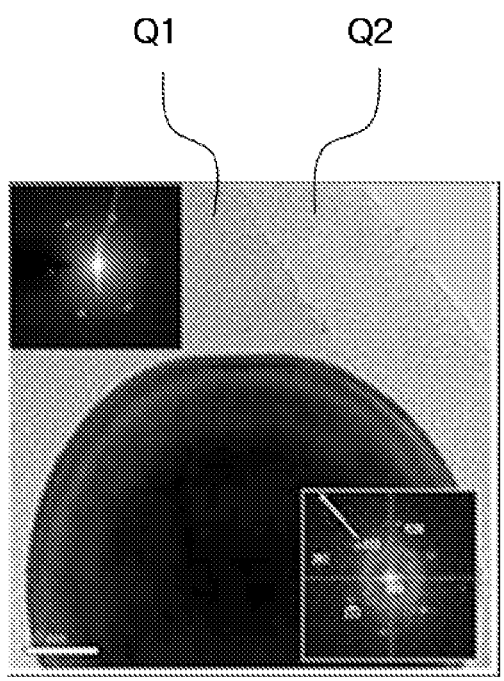

FIGS. 6A and 6B are TEM photographs showing another one of the second type of nanowires grown at P2 illustrated in FIG. 2A. As can be seen in the FIG. 6A, the nanowire has a core part and a shell part, as well as Au nanodots aligned in a certain direction in the core part. The Au nanodots are aligned in the direction of the longitudinal axis of the nanowires.

Figure 6C:
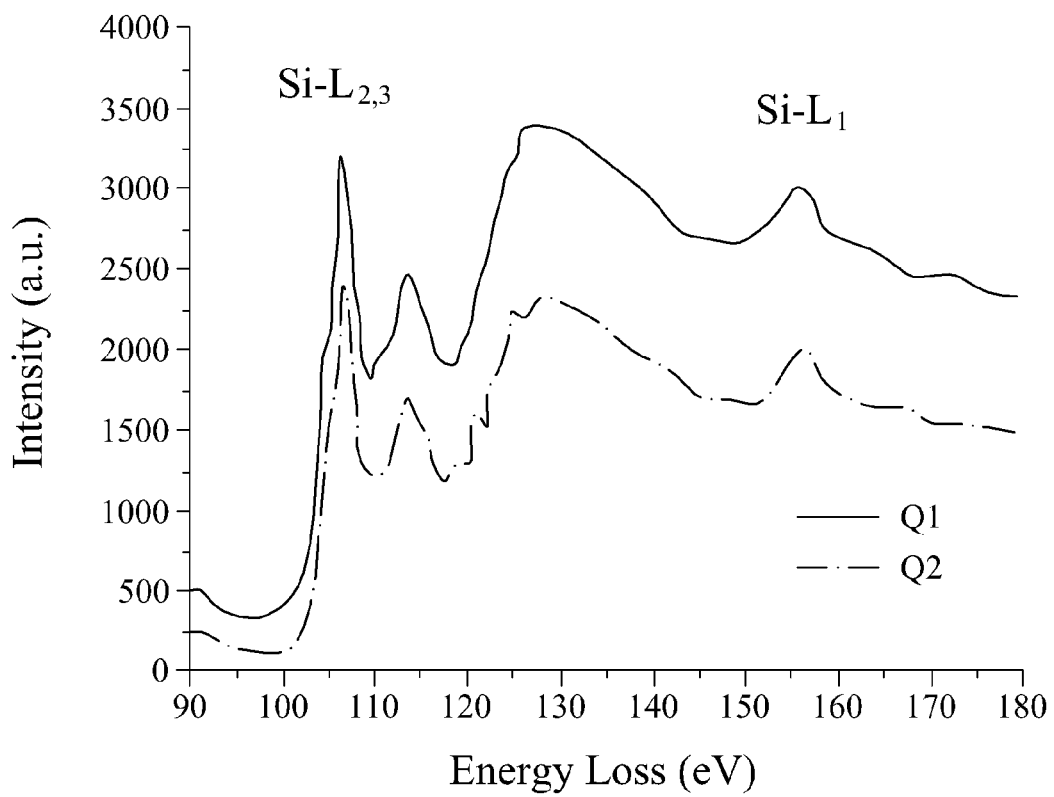
FIG. 6C is a graph illustrating EELS analysis results of the second type of nanowire formed according to Preparation Example 1 in the disclosure.

Referring to FIG. 6B, which is an enlarged photograph highlighting area Q in FIG. 6A, it is clearly observed that the nanowire includes a core part Q1 that contacts the Au nanodots and a shell part Q2 surrounding the Au nanodots. Constitutional ingredients of the core part and the shell part are determined through EELS analysis, as illustrated in FIG. 6C. $Si-L_1$ or $Si-L_{2,3}$ curves indicate positions of peaks generated due to a difference in atomic orbitals of silicon. From this, it can be demonstrated that the core part Q1 that contacts the Au nanodots includes crystalline silicon rich oxide while the shell part Q2 includes silica.

In addition, in the central portion of the substrate (indicated by the position P3) in the FIG. 2A, the nanowires do not grow to any substantial length. In general, in the position P3, the nanowires grow to a length of less than 1 μm.

It is therefore to be noted that nanowires having different shapes grow on different positions on the substrate. In other words, the shape and the type of the nanowire is position dependent.

Preparation Example 2

Formation of Nanowire

Figure 7:
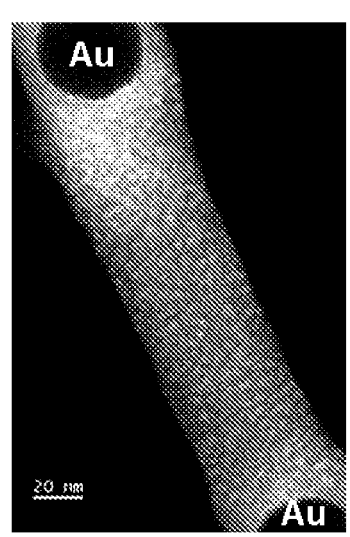
FIG. 7 is a TEM photograph showing an exemplary embodiment of a nanowire formed according to Preparation Example 2 of the present invention.

The nanowire obtained from Preparation Example 1 is heated at 1,100° C. for 360 minutes to obtain a completed nanowire. The resultant nanowire is shown in a TEM photograph of FIG. 7, wherein silicon dots may be observed inside the nanowire.

The disclosed embodiments have been described in detail with reference to the foregoing exemplary embodiments. However, these exemplary embodiments are proposed for illustrative purposes only and those skilled in the art will appreciate that various modifications and variations are possible, without departing from the scope and spirit of the disclosure. Accordingly, the scope of subject matters to be protected is dully defined only by the appended claims.

What is claimed is:
1. A nanowire comprising:
 a core part comprising a crystalline or amorphous silicon rich oxide of the formula $SiO_x$, wherein $0<x<2$;
 metal nanodots in the core part; and
 a shell part on the core part, the shell part comprising silica,
 wherein the core part contacts the metal nanodots and the shell surrounds the core part, and
 wherein the shell part of the nanowire further comprises silicon dots in the shell part.
2. The nanowire according to claim 1, wherein the metal nanodots are aligned in a direction that is parallel to the longitudinal axis of the nanowire.
3. The nanowire according to claim 1, wherein the nanowire comprises silicon dots.

4. The nanowire according to claim 2, wherein the metal nanodots comprise at least one metal selected from a group consisting of Au, Ni, Fe, Ag, Al, Pd and mixtures thereof.

5. An electronic device comprising the nanowire of claim 1.

6. The electronic device according to claim 5, wherein the electronic device is selected from a group consisting of a solar cell, a sensor, a photodetector, a light emitting diode, a laser diode, an electroluminescent device, a photoluminescent device, a cathodoluminescence device, a field effect transistor, a charge trap flash, a surface plasmon waveguide and a MOS capacitor.

7. The nanowire of claim 1, wherein the shell part has a cylindrical surface.

* * * * *